United States Patent [19]

Nguyen et al.

[11] Patent Number: 5,248,626

[45] Date of Patent: Sep. 28, 1993

[54] METHOD FOR FABRICATING SELF-ALIGNED GATE DIFFUSED JUNCTION FIELD EFFECT TRANSISTOR

[75] Inventors: Richard Nguyen; Charles A. Hewett, both of San Diego, Calif.

[73] Assignee: The United States of America as represented by the Secretary of the Navy

[21] Appl. No.: 937,916

[22] Filed: Aug. 28, 1992

[51] Int. Cl.⁵ .......................... H01L 21/265
[52] U.S. Cl. ...................... 437/41; 437/31; 437/44; 437/45; 437/48
[58] Field of Search ............... 437/41, 44, 21, 31, 437/45, 48

[56] References Cited

U.S. PATENT DOCUMENTS

| | | | |
|---|---|---|---|
| 4,314,267 | 2/1982 | Bergeron et al. | |
| 4,356,042 | 10/1982 | Gedely et al. | 437/45 |
| 4,549,193 | 10/1985 | Malhi et al. | |
| 4,816,880 | 3/1989 | Muro. | |
| 4,837,181 | 6/1989 | Galbiasi et al. | 437/48 |
| 5,047,360 | 9/1991 | Nicholas | 437/21 |
| 5,091,328 | 2/1992 | Miller | 437/45 |

FOREIGN PATENT DOCUMENTS

| | | |
|---|---|---|
| 55-74182 | 6/1980 | Japan. |
| 55-123173 | 9/1980 | Japan. |
| 55-124268 | 9/1980 | Japan. |
| 59-52882 | 3/1984 | Japan. |

Primary Examiner—Brian E. Hearn
Assistant Examiner—Kevin M. Picardat
Attorney, Agent, or Firm—Harvey Fendelman; Thomas Glenn Keough; Michael A. Kagan

[57] ABSTRACT

A method for fabricating a self-aligned, gate diffused junction field effect transistor is provided which includes the steps of forming an n-type layer on an indium phosphide, semi-insulating substrate; forming spaced apart source/drain metal contacts on the n-type layer; forming a metal gate on the n-type layer between the spaced apart source/drain contacts, where the metal gate is insulated from the source/drain contacts and includes a metallic p-type dopant material; and forming a p-type region in the n-type layer beneath the metal gate so that the gate contact and the p-type region have coincident boundaries with respect to each other at the surface of the n-type layer. The method may also be employed to manufacture a bipolar transistor by allowing the self-aligned and diffused p-type region to extend through the n-type layer to the semi-insulating substrate.

12 Claims, 3 Drawing Sheets

METHOD FOR FABRICATING SELF-ALIGNED GATE DIFFUSED JUNCTION FIELD EFFECT TRANSISTOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of transistor fabrication, and more particularly, to a method of fabricating a self-aligned, gate diffused junction field effect transistor.

In general, a junction field effect transistor (JFET) 10 (See FIG. 5) may be constructed by first forming an n-type semiconductor layer 12 on a semi-insulating substrate 14, as shown in FIG 1. A semi-insulating material may be defined as a semiconducting material having an electrical resistivity in the range of about $10^6$ to $10^8$ ohm-cm. In FIG. 2, the transistor area shown is formed by etching a mesa into the n-type semi-conducting layer 12. Next, referring to FIG. 3, an insulating layer 16 of silicon nitride or silicon dioxide is deposited on the n-type semi-conducting layer 12 to provide a masking layer. A window 18 then is opened through the insulating layer 16 and a p-type layer 20 is selectively formed in the n-type layer 20, either by diffusion or by ion implantation. The thickness and doping concentration in the p-type layer 20 when formed by diffusion, are for a given dopant, determined by the temperature inside the annealing furnace and the time the substrate is exposed to such temperature. In the ion-implantation process, the thickness and doping concentration in the p-type layers are determined by the ion energy and implant dose.

Still referring to FIG. 3, the insulating layer 16 is further patterned to open source/drain contact windows 22 to the n-type semi-conducting layer 12. As represented in FIG. 4, low resistance metal source/drain contacts 26 are formed by depositing and alloying a eutectic mixture of gold and germanium on source/drain regions 30 of the exposed n-type semi-conducting layer 12. Finally, a gate electrode 34 is formed between the source/drain contacts 26 on the p-type layer 20, as shown in FIG. 5. However, the formation of the metal source/drain contacts 26 requires an additional separate step distinct from the step of forming the p-type layer 20.

The process of forming the p-type layer 20 is critical to the performance of the JFET because the thickness and doping concentration of the p-type layer 20 determines the current flow between the source/drain contacts 26 in response to the level of an electrical voltage applied to the gate electrode 34 for a given voltage between the source/drain contacts. In order to manufacture JFET's having predetermined source to drain current characteristics, the process of creating the p-type layer 20 must be both reproducible and reliable. At the present state in the technology of compound semiconductors, the practice of the ion-implantation and diffusion processes are not fully understood sufficiently to provide the manufacture of JFETS with performance characteristics within reasonable limits between devices, and satisfactory reliability.

Such inconsistencies in the characteristics of JFETS manufactured in accordance with these prior art techniques are in part attributable to the difficulty in aligning the gate electrode 34 with the p-type layer 20 because the steps of forming the p-type layer 20 and gate electrode 34 are unrelated. Therefore, the perimeter of the p-type layer 20 tends to be misaligned with respect to the perimeter of the gate electrode 34 at the surface of the layer 12. Such misalignment causes the gate electrode 34 to have relatively high electrical resistance and capacitance, thereby resulting in a JFET with poor high frequency response, i.e., a slow switching time between conductive and nonconductive states.

Therefore, there is need for a method of manufacturing junction field effect transistors in which the source/drain and p-type region may be formed in a continuous step to reduce the time and costs required to manufacture a JFET. A further need exists for a method for manufacturing a JFET in which the p-type layer and gate electrode, or metal gate are easily aligned.

SUMMARY OF THE INVENTION

The present invention provides a method for repeatedly manufacturing junction field effect transistors having operating characteristics within prescribed limits. Such method includes the steps of forming an n-type layer on an indium phosphide semi-insulating substrate; forming spaced apart source/drain metal contacts on the n-type layer; forming a metal gate on the n-type layer between the spaced apart source/drain contacts, where the metal gate is insulated from the source/drain contacts and includes a metallic p-type dopant material; and forming a p-type region in the n-type layer beneath the metal gate so that the gate contact and the p-type region have coincident boundaries with respect to each other at the surface of the n-type layer.

The method of the present invention may also be employed to manufacture a bipolar transistor by extending the self-aligned and diffused p-type region through the n-type layer and into the semi-insulating substrate. Such method includes the steps of: forming an n-type layer on a semi-insulating substrate; forming spaced apart metal contacts on the n-type layer; forming a metal gate on the n-type layer between the spaced apart metal contacts, where the metal gate is insulated from the metal contacts and the metal gate includes a metallic p-type dopant material; and forming a p-type region in the n-type layer beneath the metal gate so that the gate contact and the p-type region have coincident boundaries with respect to each other at the surface of the n-type layer.

An advantage of the present invention is to provide a method for manufacturing junction field effect transistors with fewer processing steps than prior art methods. For example, by the method of the present invention, the source/drain contacts and diffused p-type layer are formed in a continuous step.

A still further advantage of the present invention is to provide a method for manufacturing a junction field effect transistor wherein the gate contact and p-type layer are aligned. Such alignment provides the transistor with a relatively low gate resistance and capacitance, and hence, a relatively fast switching time between conductive and nonconductive states. Because the alignment between the metal gate and p-type layer is repeatable between transistors, large numbers of transistors may be manufactured having generally uniform electrical characteristics.

Yet another advantage of the present invention is to provide a method of manufacturing a bipolar transistor.

DESCRIPTION OF THE PREFERRED EMBODIMENT

Figure 1:
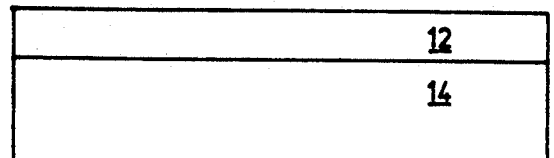
FIGS. 1-5 show cross-sectional views of a substrate in the various stages in the manufacture of a typical junction field effect transistor in accordance with prior art techniques.
Figure 2:
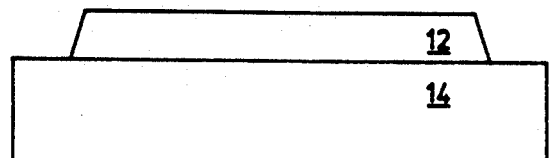
Figure 3:
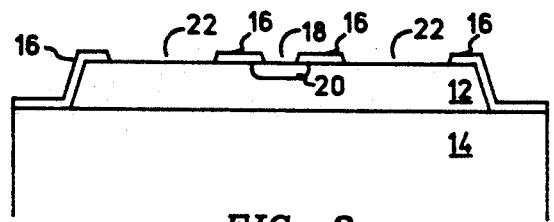
Figure 4:
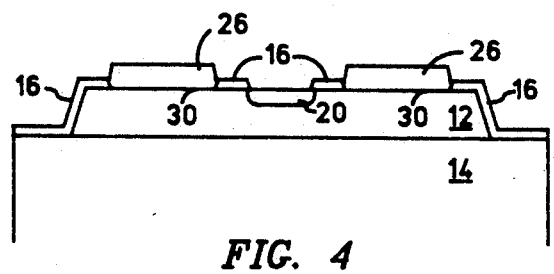
Figure 5:
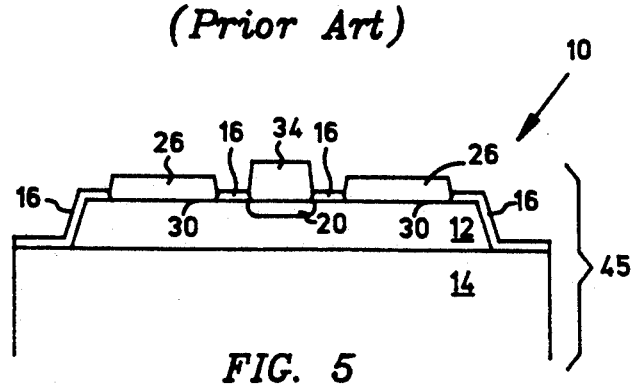
Figure 6:
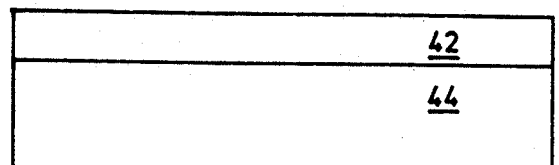
FIGS. 6-11 show cross-sectional views of a substrate in the various stages in the manufacture of a junction field effect transistor in accordance with the various techniques of the method of the present invention.

The manufacture of a self-aligned gate diffused JFET 40 (FIG. 11) in accordance with various aspects of the method of the present invention is described with reference to FIGS. 6-13. Referring now to FIG. 6, an n-type layer, or n-channel 42, which may have a donor concentration of at least $10^{17}$ donors/cm$^3$ and which may be about 0.3 μm thick, is formed on a semi-insulating substrate 44 such as indium phosphide. The n-type layer 42 is composed of a chemical compound that includes a first material selected from the group of boron, aluminum, gallium, and indium, and a second material selected from the group of nitrogen, phosphorus, arsenic, and antimony. By way of example, the semi-insulating substrate 44 is preferably manufactured of indium phosphide and doped with iron (Fe) to have a doping concentration of about $10^{12}$ donors/cm$^3$.

Figure 7:
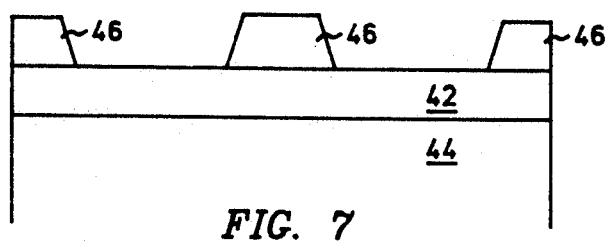
Figure 8:
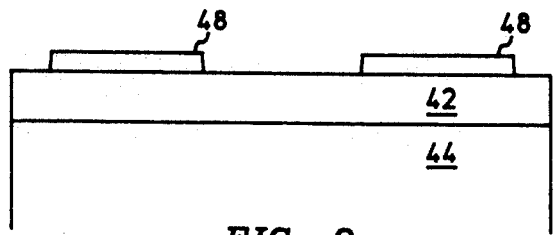
Figure 9:
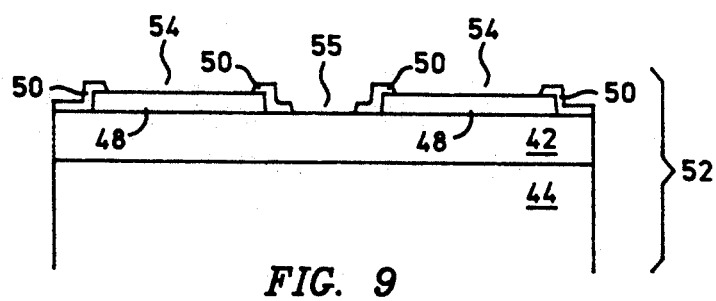

Referring to FIG. 7, a suitably patterned layer of photoresist 46 is formed over the substrate 45 and developed to expose selected areas of the n-type layer 42. Conventional photoresist lift-off techniques are used to form low resistance ohmic source/drain contacts 48, shown in FIG. 8, on such exposed areas. The contacts 48 are preferably formed by depositing and alloying a eutectic mixture of gold and germanium on the selected areas of the n-type layer 42. By way of example, the source/drain contacts 48 may be in the range of about 2000-3000Å thick. Next, an insulating layer 50 such as silicon dioxide or silicon nitride, which may be about 1000Å thick, is blanket deposited across the n-type layer 42, as for example, by well known chemical vapor deposition or sputtering techniques. The insulating layer 50 then is patterned and etched using photolithographic techniques to open windows 54 to the source and drain regions 48, as shown in FIG. 9. A gate region 55 then is defined by etching the insulating layer 50. Next, multiple metal layers, not shown, are deposited over the n-type layer 42. An acetone lift-off process may be used to selectively remove regions of the insulating layer 50 and overlying metal layers so that a gate electrode 56 remains in the gate region 55.

Figure 10:
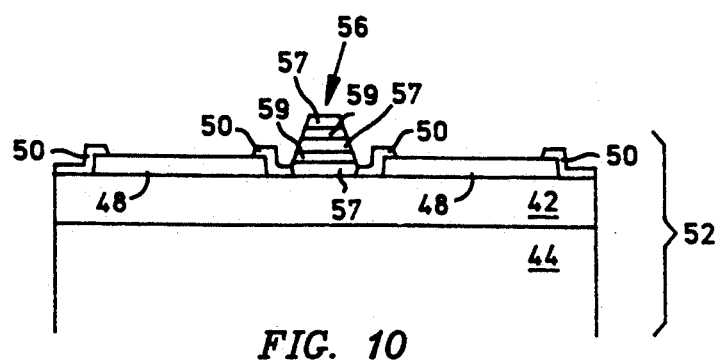

The gate electrode 56 is preferably a multilayered metal structure which may be formed using metal evaporation techniques. As shown in FIG. 10, the metal structure is comprised of a metal layer 57 formed directly on the n-type layer 42 on which alternating metal layers 59, which provide a p-type dopant, and further metal layers 57 are formed. The metal layers 57 are preferably comprised of gold which provides the gate electrode 56 with low electrical resistance. The metal layers 59 are preferably comprised of zinc which contributes p-type dopant that diffuses through the gold layers 57 into the n-type layer 42 to form a p-type region 60, as described in greater detail below. The metal layers 59 may be comprised of manganese instead of zinc. It is anticipated that the metal layers 57 may include nickel or nickel alloys as an alternative to gold.

Figure 11:
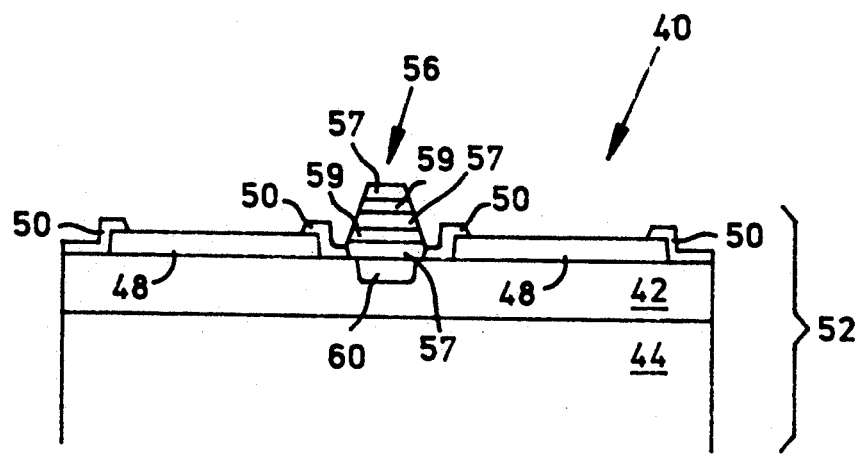

Next, referring to FIG. 11, the structure 52 is annealed to form the p-type region 60 under the gate electrode 56 by driving, or diffusing the metallic p-type dopant from the layers 59 of the gate electrode into the n-type layer 42 beneath the gate electrode 56. The p-type region 60 is "self-aligned" with respect to the gate electrode 56 because the p-type region is formed directly beneath the gate electrode in the n-type layer 42, whereby the gate electrode and p-type region have coincident boundaries with respect to each other at the surface of the n-type layer 42. Hence, the p-type region 60 may be described as a self-aligned and diffused p-type region. The annealing temperature and time are selected based on the desired thickness of the diffused p-type region 60. By way of example, where the gate electrode 56 is a multilayer structure comprised of alternating layers of gold and zinc consisting of (25Å Au) - (50Å Zn) - (25Å Au) - (50Å Zn) - (50Å Au) on a 3000Å thick layer of n-type indium phosphide (the n-type layer 42), the structure 52 may be annealed in an atmosphere comprised of argon for about one minute at approximately 375° C.

Figure 12:
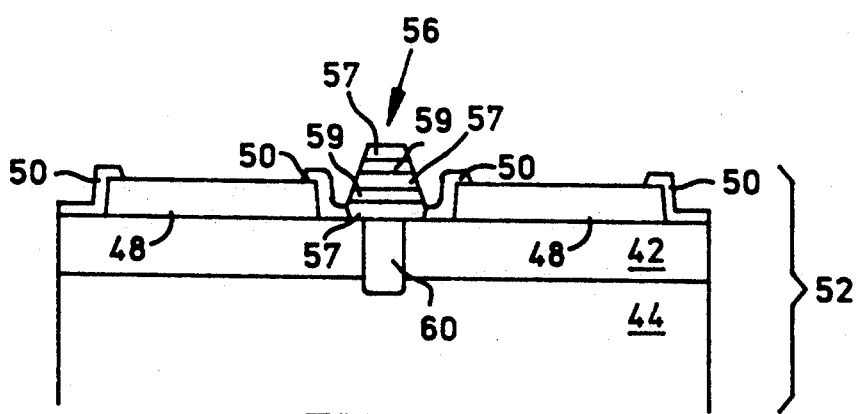
FIG. 12 is a cross-sectional view of a bipolar transistor manufactured in accordance with the various methods of the present invention.

In another implementation of the process of the present invention, as shown in FIG. 12, the p-type region 60 may be allowed to diffuse all the way through the n-type layer 42 into the semi-insulating substrate 44 to create a bi-polar transistor. Such diffusion may be achieved by increasing the heat soak time and/or the temperature to which the substrate 52 is subjected. In the manufacture of a bipolar transistor, adequate diffusion of the p-type region 60 through the n-channel 42 and into the semi-insulating substrate 44 is attained when no electrical current is detected to flow between the source/drain contacts 48 as a result of a non-zero voltage potential applied across the source/drain contacts.

Obviously, many modifications and variations of the present invention are possible in light of the above teachings. It is therefore to be understood that within the scope of the appended claims, the invention may be practiced otherwise than as specifically described.

We claim:

1. A method for fabricating a self-aligned, gate diffused junction field effect transistor comprising the steps of:

forming an n-type layer on an indium phosphide semi-insulating substrate, where said n-type layer is composed of a chemical compound that includes a first material selected from the group of boron, aluminum, gallium, and indium, and a second material selected from the group of nitrogen, phosphorus, arsenic, and antimony;

forming spaced apart source/drain metal contacts on said n-type layer;

forming an insulating layer over said metal contacts and said n-type layer;

creating an opening through said insulating layer to expose a gate region on said n-type layer between said metal contacts;

forming a metal gate on said gate region of said n-type layer, whereupon said insulating layer is interposed between said metal gate and said source/- drain metal contacts, and said metal gate includes a metallic p-type dopant material;

diffusing at least some of said p-type dopant material into said n-type layer to form a p-type region in said n-type layer beneath said metal gate so that said metal gate and said p-type region are contiguous.

2. The method of claim 1 wherein said p-type region is formed by heating said gate contact so as to diffuse said metallic p-type dopant material into said n-type layer.

3. The method of claim 2 wherein said n-type layer includes a first material selected from the group of boron, aluminum, gallium, and indium, and a second material selected from the group of nitrogen, phosphorus, arsenic, and antimony.

4. The method of claim 3 wherein said n-type layer is made of indium phosphide.

5. The method of claim 3 wherein said metal gate is comprised of multiple layers of gold and said metallic p-type dopant material interposed between said layers of gold.

6. The method of claim 5 wherein said p-type dopant material is zinc.

7. A method for fabricating a bipolar transistor comprising the steps of:

forming an n-type layer on an indium phosphide semi-insulating substrate, where said n-type layer is composed of a chemical compound that includes a first material selected from the group of boron, aluminum, gallium, and indium, and a second material selected from the group of nitrogen, phosphorus, arsenic, and antimony;

forming spaced apart metal contacts on said n-type layer;

forming an insulating layer over said metal contacts and said n-type layer;

creating an opening through said insulating layer to expose a gate region on said n-type layer between said metal contacts;

forming a metal gate on said gate region of said n-type layer, whereupon said insulating layer is interposed between said metal gate and said source/drain metal contacts, and said metal gate includes a metallic p-type dopant material;

diffusing at least some of said p-type dopant material through said n-type layer to form a p-type region in said n-type layer beneath said metal gate so that said gate contact and said p-type region are contiguous.

8. The method of claim 7 wherein said p-type region is formed by heating said gate contact so as to diffuse said metallic p-type dopant material through said n-type layer to said semi-insulating substrate.

9. The method of claim 8 wherein said n-type layer includes a first material selected from the group of boron, aluminum, gallium, and indium, and a second material selected from the group of nitrogen, phosphorus, arsenic, and antimony.

10. The method of claim 9 wherein said n-type layer is made of indium phosphide.

11. The method of claim 10 wherein said metal gate is comprised of multiple layers of gold and said metallic p-type dopant material interposed between said layers of gold.

12. The method of claim 11 wherein said metallic p-type dopant material is zinc.

* * * * *